(12) United States Patent
Scott et al.

(10) Patent No.: US 6,867,640 B2
(45) Date of Patent: Mar. 15, 2005

(54) DOUBLE-SIDED EXTENDED DRAIN FIELD EFFECT TRANSISTOR, AND INTEGRATED OVERVOLTAGE AND REVERSE VOLTAGE PROTECTION CIRCUIT THAT USES THE SAME

(75) Inventors: Greg Scott, Inkom, ID (US); J. Marcos Laraia, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 15 days.

(21) Appl. No.: 10/611,714

(22) Filed: Jul. 1, 2003

(65) Prior Publication Data

US 2005/0001672 A1 Jan. 6, 2005

(51) Int. Cl.[7] .............................. G05F 1/10; G05F 3/02
(52) U.S. Cl. ...................................... 327/541; 327/543
(58) Field of Search ......................... 327/538, 540–541, 327/543; 323/315–316

(56) References Cited

U.S. PATENT DOCUMENTS

| | | | | |
|---|---|---|---|---|
| 5,162,883 A | 11/1992 | Fujihira | ..................... | 257/139 |
| 5,498,554 A | 3/1996 | Mei | ........................... | 437/34 |
| 5,501,994 A | 3/1996 | Mei | ........................... | 437/40 |
| 5,517,379 A | 5/1996 | Williams et al. | ............. | 361/84 |
| 5,539,610 A | 7/1996 | Williams et al. | ............ | 361/246 |
| 5,548,147 A | 8/1996 | Mei | ............................ | 257/333 |
| 5,585,660 A | 12/1996 | Mei | ............................ | 257/389 |
| 5,629,542 A | 5/1997 | Sakamoto et al. | ........... | 257/328 |
| 5,757,600 A | 5/1998 | Kiraly | .......................... | 361/84 |
| 5,781,390 A | 7/1998 | Notaro et al. | .................. | 361/84 |
| 5,939,863 A | 8/1999 | Miller | ........................ | 320/136 |
| 6,043,965 A | 3/2000 | Hazelton et al. | ............. | 361/84 |
| 6,229,290 B1 * | 5/2001 | Nguyen et al. | ............. | 323/268 |
| 6,312,996 B1 | 11/2001 | Sogo | .......................... | 438/298 |
| 6,690,147 B2 * | 2/2004 | Bonto | ........................ | 323/280 |
| 2003/0020444 A1 * | 1/2003 | Kamenicky | ................. | 323/315 |
| 2004/0140845 A1 * | 7/2004 | Eberlein | ..................... | 327/541 |

* cited by examiner

*Primary Examiner*—Quan Tra
(74) *Attorney, Agent, or Firm*—Workman Nydegger (57) ABSTRACT

An integrated overvoltage and reverse voltage protection circuit that includes two p-channel double-sided extended drain transistors coupled to a high voltage source, each having their n-well coupled through a resistor to the high voltage source. For voltage regulation, a voltage divider is coupled in series with a first of these transistors, while the drain of the second transistor is coupled to the gate of the first transistor. For voltage blocking, the voltage divider may span the entire supply voltage. An n-channel transistor couples the second p-channel transistor to a low voltage source. A middle node in the voltage divider is coupled to one input of a comparator, with a reference voltage coupled to the second input. The comparator output drives the gate terminal of the n-channel transistor. A load to be protected may be disposed in parallel with the voltage divider.

20 Claims, 6 Drawing Sheets

DOUBLE-SIDED EXTENDED DRAIN FIELD EFFECT TRANSISTOR, AND INTEGRATED OVERVOLTAGE AND REVERSE VOLTAGE PROTECTION CIRCUIT THAT USES THE SAME

BACKGROUND OF THE INVENTION

1. The Field of the Invention

The present invention relates generally to extended drain field effect transistors and electrical power protection circuits. More specifically, the present invention relates to double-sided extended drain field effect transistors and an integrated overvoltage and reverse voltage protection circuit that uses double-sided extended drain field effect transistors.

2. Background and Related Art

Electrical circuits are in widespread use with a practically limitless variety of applications. Innovation in circuit design has changed the very way we live and work. Nevertheless, there are limits to electrical circuitry. One limit is that circuitry is only designed to operate with certain applied electrical voltages. If those supplied electrical voltages should vary from the designed electrical voltage conditions, circuitry may be damaged or destroyed. Such damage or destruction is most often undesired and may often even be unacceptable. Accordingly, various electrical protection circuits have been developed.

The purpose of such protection circuits is to ensure that a load electrical circuit is protected from anomalous applied electrical conditions. Some protection circuits substantially stop any power at all from being delivered to the load circuit if anomalous voltage conditions are applied to the protection circuit. Other protection circuits called voltage regulators control the supplied voltage such that useful voltages are applied to the load circuit despite anomalous supply voltages being externally applied. Voltage regulators are especially useful when it is necessary for the load circuit to continue to operate despite excessive applied supply voltages.

One application in which anomalous applied voltages may occur is in the automotive environment in which a battery supplies power to circuitry throughout the vehicle. In many cases, the vehicle circuitry is not powered directly from the battery. Instead, the vehicle circuitry is powered by a regulator that lowers the battery voltage and smoothes out the transients in the battery voltage. For example, a typical regulator may receive a battery voltage of up to approximately 16 volts and use that voltage to generate a regulator voltage of just 5 volts.

It is not usual in such a vehicle to have the vehicle circuitry experience transient surges of excessive voltages. Protection from such excessive voltages is often termed "overvoltage protection." Excessive voltage may occur in a vehicle, for example, when certain vehicle circuitry, which is supposed to be supplied by a lower regulated voltage, is directly connected to a battery, which characteristically supplies a much higher voltage. Excessive voltage may also occur in what is called a "double-battery condition" in which two batteries are wrongly connected in series instead of in parallel during a jump-start. This double-battery condition can raise the supplied voltage up to the range from 25 to 30 volts. Yet another type of overvoltage is called "load dump" which occurs when the load current in a vehicle alternator is interrupted. Voltage peaks in the range of 40 to 80V can be generated under the load dump condition.

Also, sometimes the battery may be inadvertently connected in reverse, in which case the load circuitry may be subject to applied electrical voltages that have opposite polarity as compared to the designed applied voltages. Without protection, this may result in normally reverse-biased PN semiconductor junctions to be forward-biased, which can devastate semiconductor-based circuitry. Protection from such reverse power voltages is often called "reverse voltage protection." Overvoltage and reverse voltage conditions, while common in automotive applications, may occur with significant regularity in other applications as well.

Accordingly, protection circuits have been developed to act as a buffer between an applied supply voltage and the load circuitry such that when anomalous supply voltages occur, the anomalous supply voltage is either blocked from reaching the load circuitry entirely, or else the anomalous supply voltage is regulated such that the voltage applied to the load circuitry is appropriate. It is advantageous to have such protection circuits be integrated (e.g., on the same semiconductor die) as the load circuit being protected. This reduces the cost, size and power requirements of the combination of the protection and load circuits.

Some protection circuits are designed for reverse voltage protection, while others are designed for overvoltage protection. Integrating such functionality into a single circuit would result in a smaller design than a combination of non-integrated reverse voltage and overvoltage protection circuits. The less complex the design, the less area is consumed on the chip. With increasing amounts of functionality being incorporated onto a single chip, and with chips being incorporated into increasingly confined areas, it becomes increasingly important to minimize as much as is reasonable the amount of room any one circuit on the chip occupies.

In addition, many protection circuits use depletion mode transistors (normally on) or devices such as bipolar transistors, Schottky diodes, or other types of devices that also may not be available in many standard Complementary Metal-Oxide-Silicon (CMOS) processes. Even if available, the process complexity involved with fabricating such devices is higher. Thus, the presence of such devices increases the cost of the circuit. Also, such devices may significantly increase the voltage drop across the protection circuit even if the applied supply voltages are within the designed tolerances of the load circuit. Many protection circuits also may require oscillators, charge pumps, DC-DC converters, or other complex circuits that may significantly increase the cost, size and power dissipation of the protection circuit.

Therefore, what is desired are overvoltage protection circuits that may have integrated reverse voltage protection functionality incorporated therein, and which may be suitable for integration with the load circuit being protected. It would also be advantageous if the protection circuit had a smaller design that did not require complex circuitry or devices that are difficult to fabricate using standard CMOS processes.

Typical voltage regulators and reverse voltage protection circuits do not use doubled-sided extended drain field effect transistors. Instead, conventional extended drain field effect transistors are used for switching of higher voltages. One conventional extended drain field effect transistor that may be fabricated using standard CMOS processes is illustrated in cross-section in FIG. 4 as transistor 400.

Figure 4:
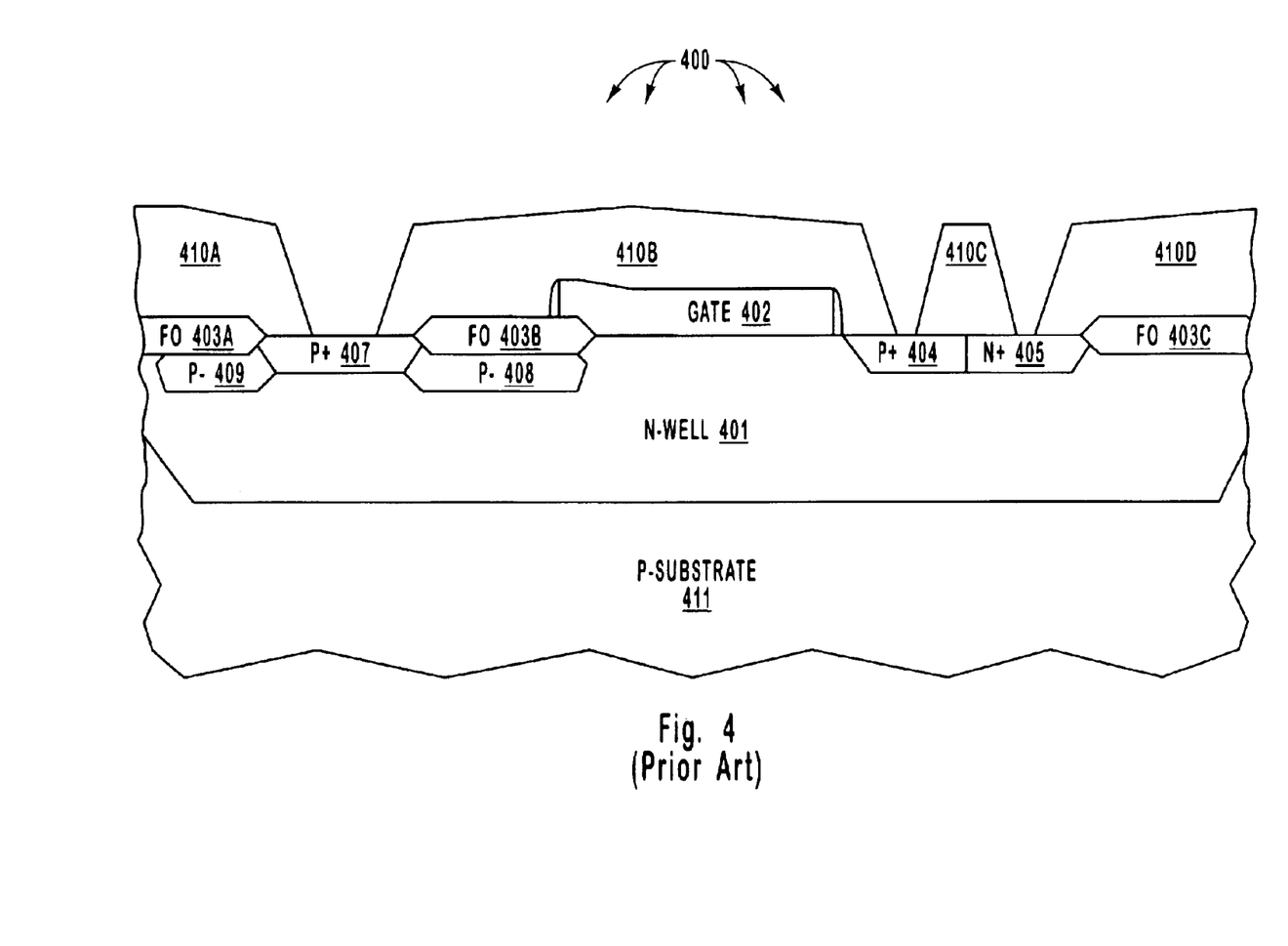
FIG. 4 illustrates a single-sided extended drain field effect transistor in accordance with the prior art.

The transistor 400 is a p-channel transistor that is fabricated in an n-well 401 within a p-type substrate 411. The transistor 400 further includes a gate terminal 402, a source terminal 404, and a drain terminal 407. Field oxides regions 403A, 403B, and 403C are positioned as illustrated. Terminal 405 is used to bias the n-well 401. Oxide layer 410 represented by regions 410A, 410B, 410C and 410D overlies portions of the transistor 400 to provide protection and electrical isolation from an upper metal layer except through the via holes represented by the gaps in the oxide layer 410.

Unlike conventional field-effect transistors, the gate terminal 402 of the extended drain field effect transistor is laterally separated from the drain terminal 407. In particular, a more lightly doped p-region 408 (also referred to as a p-RESURF region) is implanted between the gate terminal 402 and the drain terminal 407. "RESURF" is short for "REduced SURface Field". The p-RESURF 408 operates to electrically connect the drain terminal 407 to the channel region underneath the gate terminal 402. The p-RESURF region 408 also serves as a region that may sustain large voltage drops in cases when the voltage at the channel region far exceeds the voltage at the drain terminal 407. Accordingly, large differential voltages may be isolated from the remaining circuitry even when the transistor is switching high voltages.

An additional p-region 409 is laterally disposed on the other side of the p+ drain terminal 407. Together, the p-RESURF regions 408 and 409 significantly increase the breakdown voltage of the p+ drain terminal 407 with respect to the n-well 401. Accordingly, the transistor 400 is well suited for switching high voltages.

The extended drain transistor 400 thus has increased breakdown voltage at the drain. This is sufficient for switching high voltages. However, in other applications in which the extended drain transistor has not been conventionally incorporated, there may be instances in which increased breakdown voltage for the source terminal would also be advantageous.

SUMMARY OF THE INVENTION

In accordance with the present invention, an integrated overvoltage and reverse voltage protection circuit includes two double-sided extended drain field effect transistors of a first carrier type (e.g., one of a p-channel or n-channel). The source terminal of each of these transistors is coupled to a first voltage source. A second of the transistors has a drain terminal coupled to the gate terminal of the first transistor. A high value resistor couples the body terminal of both of the transistors to the first voltage source.

In one embodiment in which the overvoltage protection circuit regulates excessive supply voltages, a voltage divider includes second and third resistors that couple the drain terminal of the first transistor to a second voltage source. In another embodiment in which the overvoltage protection circuit blocks any excessive supply voltage, the voltage divider includes second and third resistors directly coupled in series between the first voltage source to the second voltage source. A load to be protected may be placed in parallel with the voltage divider between the drain of the first transistor and the second voltage source. An extended drain transistor of a second carrier type (e.g., the other of n-channel or p-channel) opposite the first carrier type couples the drain of the first p-channel transistor to the second voltage source. A middle node in the voltage divider is coupled to one input terminal of an amplifier, while the other input terminal is coupled to a reference The use of double-sided extended drain field effect transistors permits a less complex design for the protection circuit that thereby reduces layout complexity and size. Furthermore, the voltage regulator and reverse voltage protection circuit are integrated to allow for more convenient use in applications in which both overvoltage and reverse voltage conditions may apply. Furthermore, the circuit may be fabricated using standard CMOS processes and does not require components external to the chip to operate.

The double-sided extended drain field effect transistor includes a gate terminal that overlies a channel region of a substrate. The transistor also includes a drain region and a source region that are both laterally separated from the channel region by RESURF regions. "RESURF" is short for "REduced SURface Field". Such RESURF regions operate to increase the breakdown voltage at both the source and drain sides of the transistor. Accordingly, the double-sided extended drain field effect transistor is ideally suited for applications such as the integrated voltage regulator and reverse voltage protection circuit as such circuits impose strong reverse biases in both the drain region with respect to the body terminal, and the source region with respect to the body terminal.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

The present invention relates to an integrated overvoltage and reverse voltage protection circuit that implements double-sided extended drain field effect transistors to thereby effect a design that occupies relatively little area and that may be implemented using standard CMOS processes.

Figure 1:
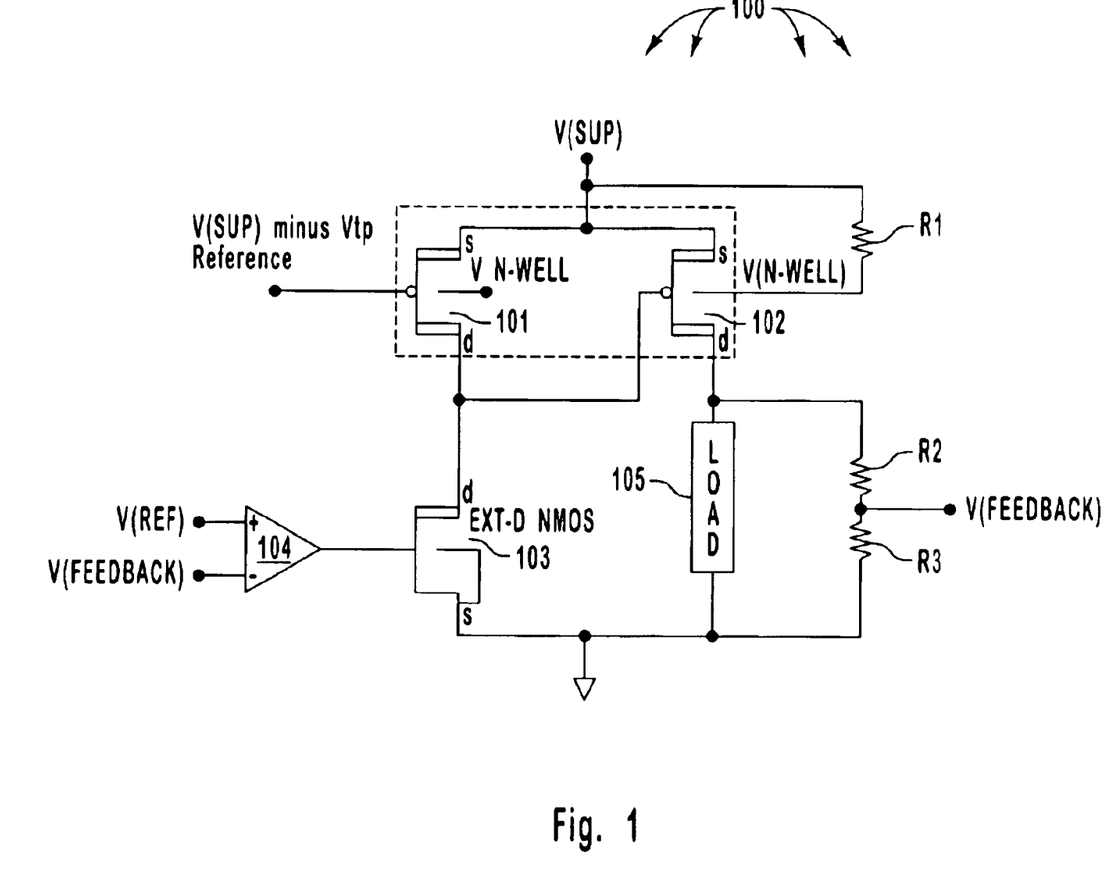
FIG. 1 illustrates an integrated voltage regulator and reverse voltage protection circuit in accordance with the principles of the invention in which double-sided extended drain field effect transistors are used.

FIG. 1 illustrates an integrated voltage regulator and reverse voltage protection circuit 100 in accordance with the principles of the present invention. The circuit 100 includes two p-channel double-sided extended drain field effect transistors 101 and 102. In this description and in the claims, a "double-sided extended drain field effect transistor" is any field effect transistor in which there is a RESURF region between the drain terminal and the channel region, and another RESURF region between the source terminal and the channel region. "RESURF" is short for "REduced SURface Field". The circuit 100 also includes an n-channel extended drain field effect transistor 103. The n-channel extended drain field effect transistor may be an n-channel single-sided extended drain field effect transistor as illustrated in FIG. 1, or may alternatively be an n-channel double-sided extended drain field effect transistor. In this description and in the claims, a "single-sided extended drain field effect transistor" means any field effect transistor in which a RESURF region separates only one of the drain or source terminals from the channel region. An "extended drain field effect transistor" means either a single-sided or double-sided extended drain field effect transistor. The circuit 100 further includes an amplifier 104, and resistors R1, R2 and R3. Although the load 105 that is being protected may be off-circuit, the load 105 may be integrated with the circuit 100.

As illustrated, the source terminal of the double-sided extended drain field effect transistor 101 is coupled to the voltage supply V(SUP). In this description and in the claims, two nodes in a circuit are "coupled" if charge may flow from one node to the other during normal operation of the circuit, if even with some resistance. The drain terminal of the double-sided extended drain field effect transistor 101 is coupled to the gate terminal of the double-sided extended drain field effect transistor 102. The body regions of both double-sided extended drain field effect transistors 101 and 102 are n-wells and are coupled in common and (through the resistor R1) to the supply voltage V(SUP). The resistor R1 is a high value resistor that may be composed of, for example, high resistance polysilicon.

The drain terminal of the n-channel single-sided extended drain field effect transistor 103 is coupled to the drain terminal of the p-channel double-sided extended drain field effect transistor 101. The source terminal of the n-channel single-sided extended drain field effect transistor 103 is coupled to a low voltage supply. The load 105 is coupled in parallel with the series combination of resistors R2 and R3 between the drain terminal of the p-channel double-sided extended drain field effect transistor 102 and the low voltage supply.

Having described the structure and various interconnections of the circuit 100, the operation of the circuit 100 will now be described. The p-channel double-sided extended-drain field effect transistor 102 controls current from the supply pin illustrated as having voltage V(SUP) to the load 105. The other p-channel double-sided extended-drain field effect transistor 101 is used to bias the gate terminal of the controlling p-channel transistor 102.

The gate terminal of p-channel transistor 101 is connected to a reference potential generated relative to the supply voltage V(SUP). For example, the reference voltage may be the supply voltage V(SUP) minus the threshold voltage Vtp of the p-channel transistor 101. This reference bias limits the current flowing through device 101. Note that there is feedback in that the voltage V(FEEDBACK) is fed back into the lower input terminal of the amplifier 104. If the n-channel single-sided extended drain field effect transistor 103 is turned on by this feedback, the drain current of the p-channel transistor 101 will pull the gate potential of the controlling p-channel transistor 102 below the supply voltage V(SUP) allowing current to flow through the p-channel transistor 102 to the load 105. If the n-channel transistor 103 is turned off by the feedback, the drain current of the p-channel transistor 101 will raise the gate voltage of the controlling p-channel transistor 102 to the supply voltage V(SUP) shutting off the controlling p-channel transistor 102 so that little, if any current will flow to the load 105.

With this in mind, the circuit 100 performs voltage regulation when V(SUP) is too high as follows. The drain current of the n-channel transistor 103 is controlled by the voltage at the load 105. As the voltage on the load 105 increases due to an increased supply voltage V(SUP) to a point where V(FEEDBACK) becomes larger than V(REF), the amplifier 104 reduces the voltage on the n-channel transistor 103 which, in turn, increases the voltage on the gate of controlling p-channel transistor 102 and thereby lowering the current to the load 105.

When a reverse voltage condition occurs, the supply voltage V(SUP) is negative with respect to ground. During a reverse battery condition, if the circuit 100 is integrated on a standard P-Substrate CMOS process where the P-substrate is connected to ground, the n-Well that represents the body terminal of p-channel transistors 101 and 102 will be forward biased with respect to the P-substrate. In this condition, the high value, current limiting resistor R1 limits the current through the forward biased diodes of all N-Wells connected to V(SUP).

Accordingly, both voltage regulation and reverse voltage protection is accomplished using a single integrated circuit. Not counting the load 105, the circuit 100 only includes one amplifier, three transistors, and three resistors. Accordingly, the area consumed by the circuit 100 may be quite small.

Figure 2:
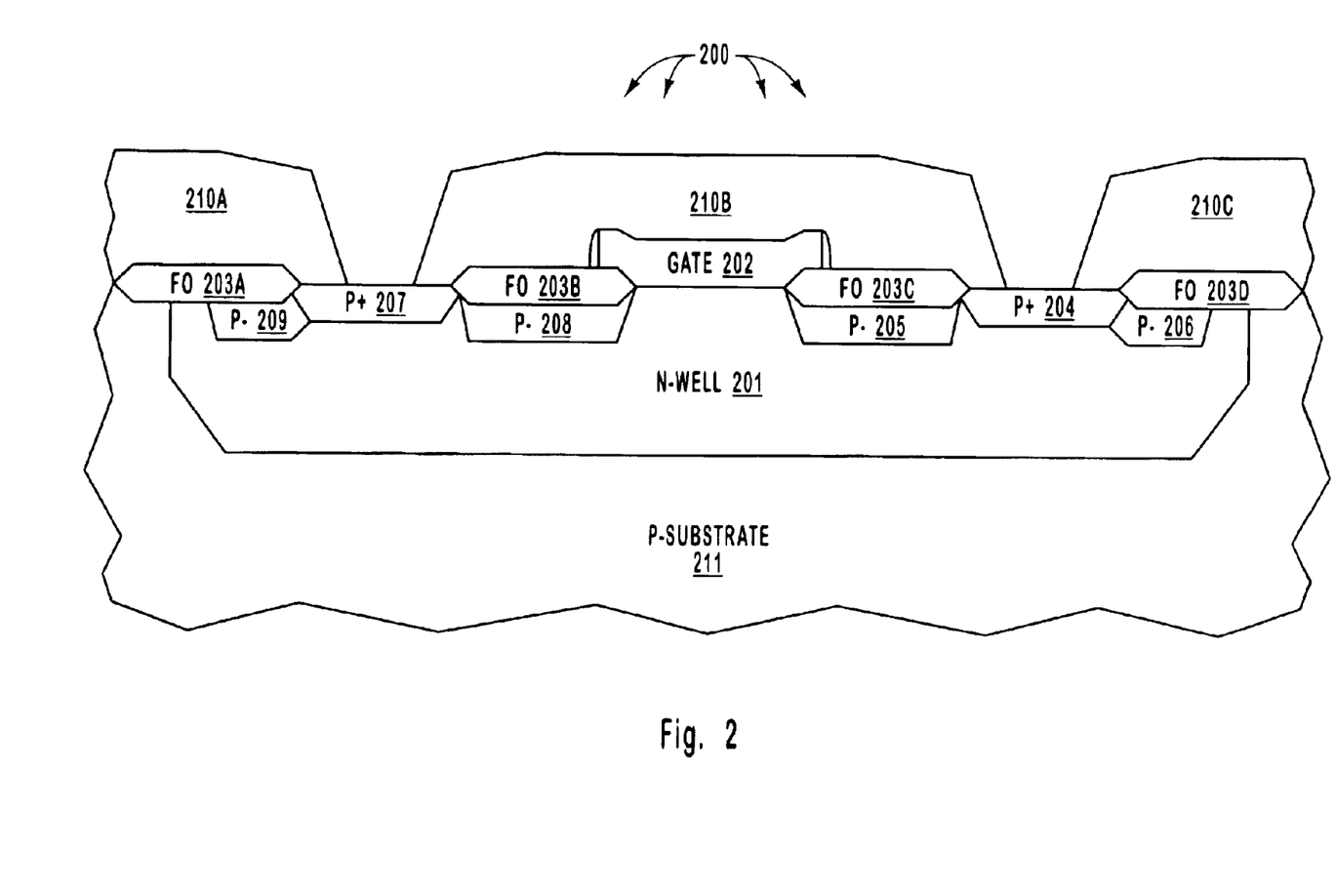
FIG. 2 illustrates a double-sided extended drain p-channel field effect transistor in accordance with the principles of the present invention that may be used for each of the p-channel double-sided extended drain field effect transistors of FIG. 1.

FIG. 2 illustrates a cross section of a p-channel double-sided extended-drain field effect transistor 200. The transistor 200 may be used for each of the p-channel double-sided extended drain field effect transistors 101 and 102 of FIG. 1, although the transistor 200 represents a unique transistor design that may be useful in any application in which both the source and drain of the transistor may be subject to high reverse bias voltages with respect to the body terminal. The double-sided extended drain field effect transistor significantly increases the breakdown voltage at both the source and drain terminals. Accordingly, there is far less likelihood of breakdown occurring in cases in which both the source and drain terminals are subject to high reverse biasing with respect to the body terminal.

The transistor 200 is fabricated on a p-type substrate 211. An n-well 201 is formed in the p-type substrate 211. Furthermore, the transistor includes gate terminal 202, source terminal 207 and the drain terminal 204. The gate terminal 202 does not laterally extend to either the source terminal 207 or the drain terminal 204, but is laterally spaced from the source terminal 207 and the drain terminal 204. A field oxide layer 203B is laterally disposed between the gate terminal 202 and the source terminal 207. A field oxide layer 203C is laterally disposed between the gate terminal 202 and the drain terminal 204. Other field oxide layers 203A and 203D formed by the same oxide growth and patterning steps as the oxides 203B and 203C may also be present. Oxide layer 210 represented by portions 210A, 210B and 210C may overlie the entire structure to provide selective electrical isolation from an upper metal layer. A thin oxide resides vertically between the gate terminal 202 and the n-well although the oxide layer is too thin to distinguish in FIG. 2.

Additionally, a p-RESURF region 205 is laterally positioned between the drain terminal 204 and the channel region underneath the gate terminal 202 as shown. The p-RESURF region 205 operates to electrically connect the drain terminal 204 to the channel region underneath the gate terminal 202. The p-RESURF region 205 also serves as a region that may sustain large voltage drops in cases when the voltage at the channel region far exceeds the voltage at the drain terminal 204. An additional p-region 206 may be laterally disposed on the other side of the drain terminal 204. Together, the p-RESURF region 205 and the p-region 206 significantly increase the breakdown voltage of the drain terminal 204 with respect to the n-well 201.

Unlike conventional single-sided extended drain field effect transistors, a p-RESURF region 208 is also laterally positioned between the source terminal 207 and the channel region. The p-RESURF region 208 performs the same functions for the source terminal 207 as are attributed to the p-RESURF region 205 for the drain terminal 204. Furthermore, an additional p-region 209 may be laterally disposed on the other side of the source terminal 207. The p-region 209 performs the same functions for the source terminal 207 as are attributed to the p-region 206 for the drain terminal 204.

When a reverse voltage event occurs (e.g., V(SUP) is negative), the interface between the n-well 201 and the substrate 211 becomes forward biased. Therefore, the potential of the n-well 201 will be fixed at approximately –0.6V (assuming that the substrate is fixed at ground). The drain voltage will drop to approximately ground, while the source voltage will drop to a negative value equal to the negative voltage of V(SUP). This negative source voltage is typically greater in magnitude than a standard P+ source to n-well breakdown voltage. By using the double-sided extended-drain transistor 200, the breakdown voltage at the interface between the source terminal 207 and the n-well 201 is increased above the magnitude of the reverse voltage. Accordingly, the use of p-RESURF region 208 and p-region 209 isolates the circuit from the negative potential which would damage the circuit under a reverse voltage condition.

Accordingly, the p-channel double-sided extended drain field effect transistor 200 has high breakdown voltages between the source terminal 207 and the n-well 201, as well as between the drain terminal 204 and the n-well 201. The transistor 200 is thus well suited for applications such as that of FIG. 1 in which the drain terminal and source terminals may experience strong reverse biases with respect to the n-well.

Although the transistor 200 has been described as a p-channel transistor, a similar n-channel device may also be constructed, using the principles of the present invention, by replacing regions of a first carrier type (e.g., p-type or n-type) of the illustrated transistor 200 with regions of the opposite carrier type (e.g., n-type or p-type). Although the specific fabrication parameters for the transistor 200 have not been described, such fabrication techniques will be within the knowledge of those of ordinary skill in the art after having reviewed this description and associated figures. As will be apparent to those of ordinary skill in the art after having reviewed this description and associated figures, the fabrication of the transistor 200 may be performed using standard CMOS processes.

Figure 3:
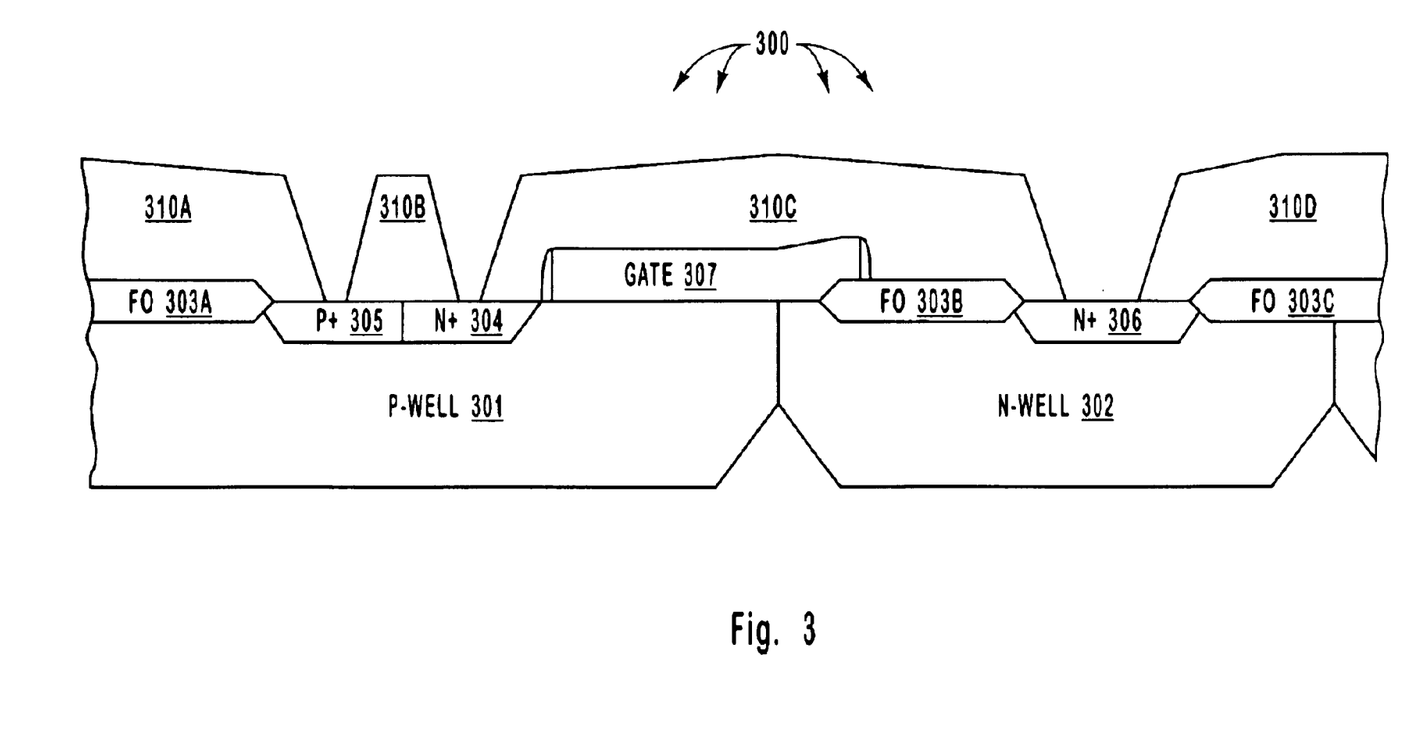
FIG. 3 illustrates a single-sided extended drain n-channel field effect transistor that may be used for the n-channel single-sided extended drain field effect transistor of FIG. 1.

The n-channel single-sided extended drain field effect transistor 103 may be any extended drain field effect transistor including those conventionally available. However, FIG. 3 illustrates an n-channel single-sided extended drain field effect transistor 300 that may be used as the n-channel single-sided extended drain field effect transistor 103 of FIG. 1.

The transistor 300 includes a gate terminal 307, a source terminal 304, a drain terminal 306, and field oxide layer 303 including components 303A, 303B and 303C. The source terminal is coupled to the substrate via p+ doped region 305. A p-well 301 and n-well 302 are disposed within the substrate as illustrated. Oxide layer 310 including components 310A, 310B, 310C and 310D, selectively isolates the other transistor components from upper metal layers.

The transistor 300 may also be fabricated using standard CMOS processes as will be apparent to those of ordinary skill in the art after having reviewed this description and the-associated figures. The other components 104 and R1, R2 and R3 may also be fabricated using CMOS processes. Accordingly, the entire integrated voltage regulator and reverse voltage protection circuit 100 of FIG. 1 may be constructed using standard CMOS processes, and also does not require external circuit components. This reduces the cost of the fabrication. If the load 105 may be fabricated on a chip, then the load 105 may be integrated with the circuit 100 on the same chip. If the load 105 may be fabricated using standard CMOS processes, then the entire circuit 100 with the load 105 may be fabricated using standard CMOS processes.

Figure 5:
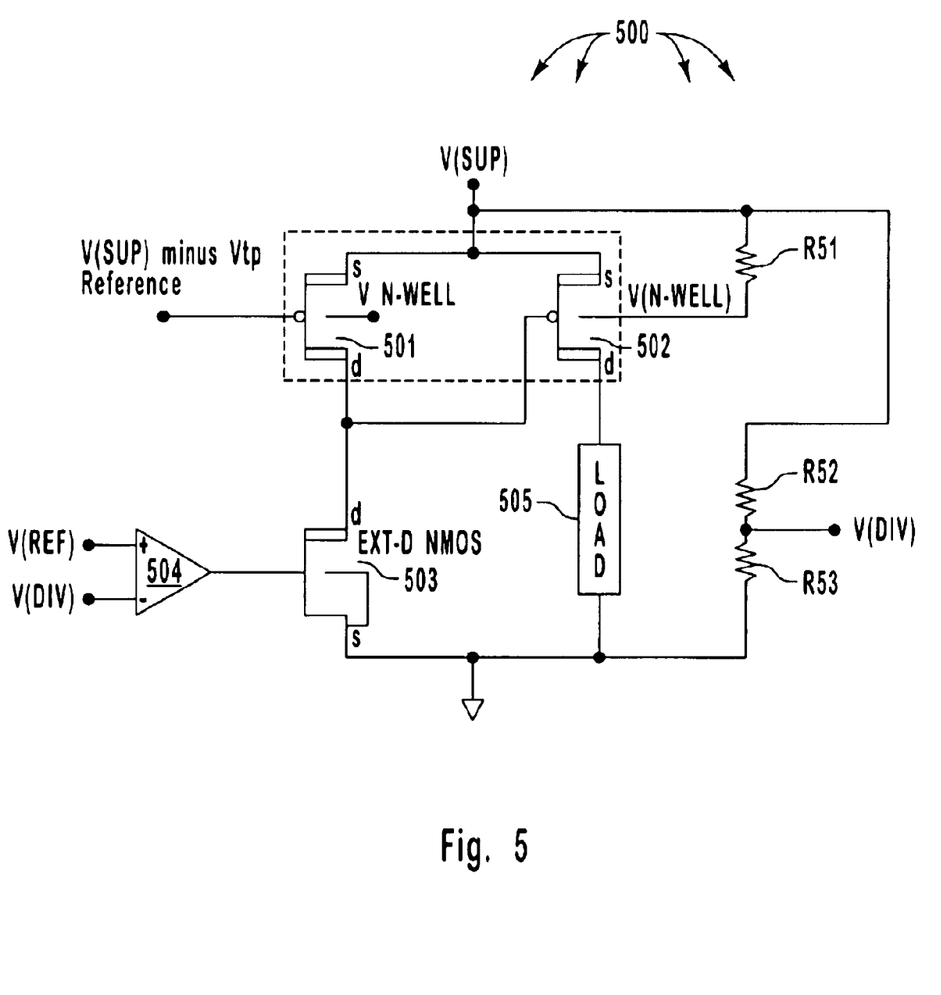
FIG. 5 illustrates an integrated overvoltage and reverse voltage protection circuit in accordance with the principles of the invention in which double-sided extended drain field effect transistors are used.

FIG. 5 illustrates an integrated overvoltage blocking and reverse voltage protection circuit 500 in accordance with an alternative embodiment of the present invention. The elements 501, 502, 503, 504, 505, R51, R52 and R53 may be the same as described above for elements 101, 102, 103, 104, 105, R1, R2 and R3 respectively. In this embodiment, however, the voltage divider that includes the series combination of resistors R52 and R53 spans the entire voltage supply rails. The element 504 compares the voltage V(DIV) generated by the resistive divider with a reference voltage V(REF). If V(DIV) is lower than V(REF), the voltage supply V(SUP) is considered to be at a safe level and is applied to the load through element 502. The circuit 500 would operate to block voltage from reaching the load 505 during an overvoltage condition.

Figure 6:
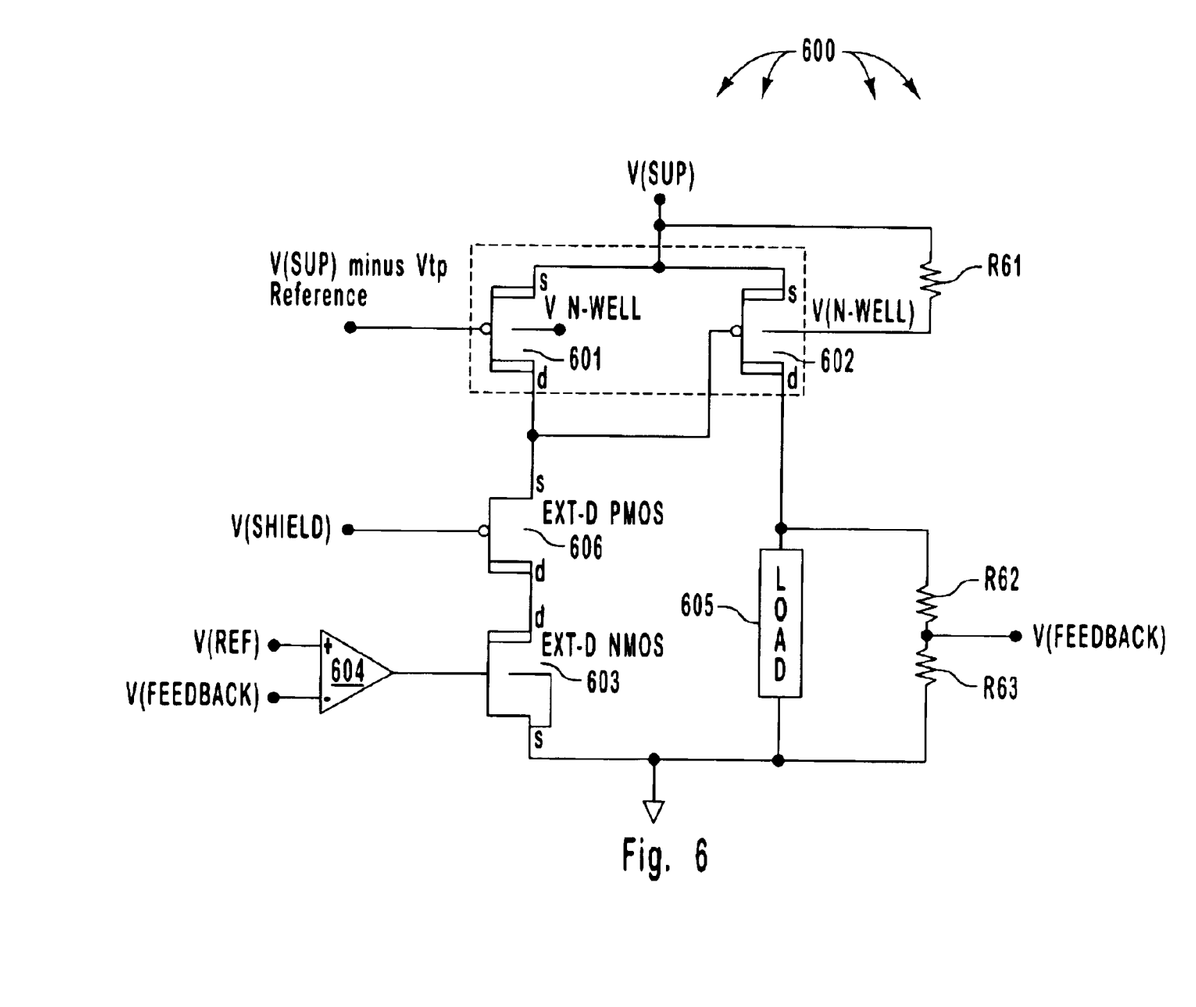
FIG. 6 illustrates an integrated voltage regulator and reverse voltage protection circuit in accordance with the principles of the invention in which double-sided extended drain field effect transistors are used, and in which the gate protection is implemented.

FIG. 6 illustrates an integrated voltage regulator and reverse voltage protection circuit 600 in accordance with another aspect of the present invention. The elements 601, 602, 603, 604, 605, R61, R62 and R63 may be the same as described above for elements 101, 102, 103, 104, 105, R1, R2 and R3 respectively. The circuit 600 has an additional p-channel extended drain field effect transistor 606 coupled in series between the transistors 601 and 603 as shown. The source terminal of the transistor 606 is connected to the gate terminal of the transistor 602. In this configuration, the gate terminal of the transistor 602 is protected from excessively high voltages during an overvoltage condition. The modification to FIG. 1 shown in FIG. 5 may be added to the modification to FIG. 1 shown in FIG. 6.

The present invention may be embodied in other specific forms without departing from its spirit or essential characteristics. The described embodiments are to be considered in

What is claimed and desired to be secured by United States Letters Patent is:

1. An integrated voltage regulator and reverse voltage protection circuit comprising the following:
   a first double-sided extended drain field effect transistor of a first carrier type and having a source terminal coupled to a first voltage source;
   a second double-sided extended drain field effect transistor of the first carrier type and also having a source terminal couple to the fast voltage source, and having a drain terminal coupled to a gate terminal of the first double-sided extended drain field effect transistor of the first carrier type;
   a first resistor that is coupled between the first supply voltage and a body terminal of the first double-sided extended drain field effect transistor of the first carrier type and a body terminal of the second double-sided extended drain field effect transistor of the first carrier type;
   a second resistor;
   a third resistor coupled with the second resistor in series between a drain terminal of the first double-sided extended drain field effect transistor of the first carrier type and a second voltage source;
   an extended drain field effect transistor of a second carrier type opposite the first carrier type, having a drain terminal coupled to the drain terminal of the second double-sided extended drain field effect transistor, and having a source terminal coupled to the second voltage source; and
   an amplifier having an output terminal coupled to a gate terminal of the extended drain field effect transistor of the second carrier type.

2. A circuit in accordance with claim 1, wherein the extended drain field effect transistor of the second carrier type is a single-sided extended drain field effect transistor of the second carrier type.

3. A circuit in accordance with claim 1, wherein the extended drain field effect transistor of the second carrier type is a double-sided extended drain field effect transistor of the second carrier type.

4. A circuit in accordance with claim 1, wherein the first carrier type is n-channel, and wherein the second carrier type is p-channel.

5. A circuit in accordance with claim 1, wherein the first carrier type is p-channel, and wherein the second carrier type is n-channel.

6. A circuit in accordance with claim 1, wherein the circuit further comprises a load circuit coupled between the drain terminal of the first double-sided extended drain field effect transistor and the second voltage source.

7. A circuit in accordance with claim 6, wherein the circuit is integrated on a single chip.

8. A circuit in accordance with claim 1, wherein a node between the second and third resistors is couple to a first input terminal of the amplifier.

9. A circuit in accordance with claim 1, wherein a second input terminal of the amplifier is configured to be connected to a reference voltage.

10. A circuit in accordance with claim 9, wherein the reference voltage is a first reference voltage, wherein a gate terminal of the second double-side extended drain field effect transistor of the first carrier type is configured to be coupled to a second voltage.

11. A circuit in accordance with claim 10, wherein the second voltage reference is different that the first voltage source by a factor equal to the absolute value of a threshold voltage of the second double-sided extended drain field effect transistor of the first carrier type.

12. A circuit in accordance with claim 1, wherein the first double-sided extended drain field effect transistor of the first carrier type comprises the following:
   a substrate; and
   a gate terminal overlying the substrate over a channel region in the substrate, wherein the substrate further comprises the following:
   a drain region of the first carrier type, wherein the drain region is laterally separated from the channel region by a first RESURF region of the first carrier type; and
   a source region of the first carrier type, wherein the source region is laterally separated from the channel region by a second RESURF region of the first carrier type.

13. A circuit in accordance with claim 12, wherein the substrate further comprises the following:
   a third RESURF region of the first carrier type disposed laterally bordering the drain region on a side that is remote front the channel region; and
   a fourth RESURF region of the first carrier type disposed laterally bordering the source region on a side that is remote from the channel region.

14. A circuit in accordance with claim 1, wherein the first double-sided extended drain field effect transistor of the first carrier type is a first extended drain field effect transistor of the first carrier type, and the second double-sided extended drain field effect transistor of the first carrier type is a second extended drain field effect transistor of the first carrier type, the circuit further comprising the following:
   a third extended drain field effect transistor of the first carrier type having a drain terminal coupled to the drain terminal of the extended drain field effect transistor of the second carrier type, and having a source terminal coupled to the drain terminal of the second extended drain field effect transistor of the first carrier type and to the gate terminal of the first extended drain field effect transistor of the first carrier type.

15. An integrated over voltage and reverse voltage protection circuit comprising the following:
   a first double-sided extended drain field effect transistor of a first carrier type and having a source terminal coupled to a first voltage source;
   a second double-sided extended drain field effect transistor of the first carrier type and also having a source terminal couple to the first voltage source and having a drain terminal coupled to a gate terminal of the first double-sided extended drain field effect transistor of the first carrier type;
   a first resistor that is coupled between the first supply voltage and a body terminal of the first double-sided extended drain field effect transistor of the first carrier type and a body terminal of the second double-sided extended drain field effect transistor of the first carrier type;
   a second resistor;
   a third resistor coupled with the second resistor in series between the first voltage source and a second voltage source;

an extended drain field effect transistor of a second carrier type opposite the first carrier type, having a drain terminal coupled to the drain terminal of the second double-sided extended drain field effect transistor, and having a source terminal coupled to the second voltage source; and a comparator having an output terminal coupled to a gate terminal of the extended drain field effect transistor of the second carrier type.

16. A circuit in accordance with claim 15, wherein a node between the second and third resistors is couple to a first input terminal of the comparator.

17. A circuit in accordance with claim 16, wherein a second input terminal of the comparator is configured to be connected to a reference voltage.

18. A circuit in accordance with claim 17, wherein the reference voltage is a first reference voltage, wherein a gate terminal of the second double-sided extended drain field effect transistor of the first carrier type is configured to be coupled to a second voltage reference.

19. A circuit in accordance with claim 18, wherein the second voltage reference is different that the first voltage source by a factor equal to the absolute value of a threshold voltage of the second double-sided extended drain field effect transistor of the first carrier type.

20. A circuit in accordance with claim 15, wherein the first double-sided extended drain field effect transistor of the first carrier type is a first extended drain field effect transistor of the first carrier type and the second double-sided extended drain field effect transistor of the first carrier type is a second extended drain field effect transistor of the first carrier type, the circuit further comprising the following:

a third extended drain field effect transistor of the first carrier type having a drain terminal coupled to the drain terminal of the extended drain field effect transistor of the second carrier type, and having a source terminal coupled to the drain terminal of the second extended drain field effect transistor of the first carrier type and to the gate terminal of the first extended drain field effect transistor of the first carrier type.

* * * * *